(12) United States Patent
Black et al.

(10) Patent No.: US 7,993,816 B2
(45) Date of Patent: Aug. 9, 2011

(54) METHOD FOR FABRICATING SELF-ALIGNED NANOSTRUCTURE USING SELF-ASSEMBLY BLOCK COPOLYMERS, AND STRUCTURES FABRICATED THEREFROM

(75) Inventors: Charles T. Black, New York, NY (US); Matthew E. Colburn, Schenectady, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 717 days.

(21) Appl. No.: 12/049,780

(22) Filed: Mar. 17, 2008

(65) Prior Publication Data
US 2009/0233236 A1    Sep. 17, 2009

(51) Int. Cl.
*G03F 7/26* (2006.01)
(52) U.S. Cl. .................... 430/311; 430/330; 430/329

(58) Field of Classification Search .................. 430/311, 430/322, 330, 394
See application file for complete search history.

(56) References Cited

U.S. PATENT DOCUMENTS

| 7,037,744 | B2 | 5/2006 | Colburn et al. | |
|---|---|---|---|---|
| 2005/0208430 | A1* | 9/2005 | Colburn et al. | 430/313 |
| 2006/0228653 | A1* | 10/2006 | Colburn et al. | 430/322 |

* cited by examiner

*Primary Examiner* — Kathleen Duda
*Assistant Examiner* — Caleen O Sullivan
(74) *Attorney, Agent, or Firm* — Scully, Scott, Murphy & Presser, P.C.; Daniel P. Morris, Esq.

(57) ABSTRACT

In one embodiment, the present invention provides a method for patterning a surface that includes forming a block copolymer atop a heterogeneous reflectivity surface, wherein the block copolymer is segregated into first and second units; applying a radiation to the first units and second units, wherein the heterogeneous reflectivity surface produces an exposed portion of the first units and the second units; and applying a development cycle to selectively remove at least one of the exposed first and second units of the segregated copolymer film to provide a pattern.

16 Claims, 5 Drawing Sheets

METHOD FOR FABRICATING SELF-ALIGNED NANOSTRUCTURE USING SELF-ASSEMBLY BLOCK COPOLYMERS, AND STRUCTURES FABRICATED THEREFROM

FIELD OF THE INVENTION

The present invention relates to the fabrication of self-aligned nanostructures, and more specifically to nanostructures generated using a combination of self-assembly and self-aligned imaging provided by copolymer films.

BACKGROUND OF THE INVENTION

The fabrication of Very-Large Scale Integrated (VLSI) or Ultra-Large Scale Integrated circuit (ULSI) requires metallic wiring that connects individual devices in a semiconductor chip, to one another. One method of creating this wiring network on such small scale is a dual damascene (DD) process. In a typical DD process, an interlayer dielectric (ILD) typically comprising two dielectric layers (e.g., a via level dielectric and a line level dielectric) is formed on a substrate. In general, the via and line level dielectrics can be made of the same or different insulating films and in the former case applied as a single monolithic layer. A hard mask layer is optionally employed to facilitate etch selectivity and to serve as a polish stop. The wiring interconnect network consists of two types of features: line features that traverse a distance across the chip, and via features which connect lines in different levels together. Historically, both dielectric layers are made from an inorganic glass like silicon dioxide ($SiO_2$) or a fluorinated silica film deposited by plasma enhanced chemical vapor deposition (PECVD).

In the dual damascene process, the position of the lines and the vias are defined lithographically in different photoresist layers and transferred into the hard mask and ILD layers using reactive ion etching processes. In one embodiment, the process sequence is a line-first approach because the trench that will house the line feature is etched first. After the trench formation, lithography is used to define a via pattern into one of the photoresist layers which is then transferred into the dielectric material to generate a via opening.

Next, the dual damascene structure is coated with a conducting liner material or material stack that serves to protect the conductor metal lines and vias and serve as an adhesion layer between the conductor and the ILD. This recess is then filled with a conducting fill material over the surface of the patterned dielectrics. The fill is most commonly accomplished by electroplating of copper, Cu, although other methods such as chemical vapor deposition (CVD) and other materials such as aluminum, Al, or gold, Au, can also be used. The fill and liner materials are then chemically mechanically polished (CMP) to be coplanar with the surface of the hard mask. A capping material is deposited over the metal or as a blanket film to passivate the exposed metal surface and to serve as a diffusion barrier between the metal and any additional ILD layers to be deposited over the interconnect structure. Silicon nitride, silicon carbide, and silicon carbonitride films deposited by PECVD are typically used as the capping material. This process sequence is repeated for each level of the interconnects on the device. Since two interconnect features are defined to form a conductor in-lay within an insulator by a single polish step, this process is designated a dual damascene process.

As with any circuit, semiconductor chips are prone to signal propagation delays which depend on the product of the line resistance, R, and the interconnect capacitance C. In order to improve the performance of semiconductor chips, manufacturers have reduced the resistivity of the metal used in fabrication by replacing Al wiring with Cu. Moreover by moving to lower dielectric constant (k) materials, manufacturers have also begun to reduce the capacitance, C, in the circuit.

The common terminology used to describe dielectric films in the semiconductor industry is to classify them as standard k (4.5<k<10), low k (k<3.0), ultra low k (2.0<k<2.5) and extreme low k (k<2.0). Ultra low k and extreme low k dielectrics generally tend to be porous with intentionally engineered voids in their structure. Since the lowest dielectric constant possible is defined by air or vacuum ($k_{vac}=1$), many have developed means to produce voids in the dielectric material. When the void volume extends and occupies substantial contiguous regions of the gaps between the lines one achieves an interconnect structure wherein the lines are nominally separated by air or vacuum as the ILD material. In the following description the term 'air bridge' is used to describe such an interconnect structure to distinguish it from structures wherein the ILD is porous with void volume dispersed randomly within a nominally contiguous solid dielectric.

The use of bottom-up approaches to semiconductor fabrication has grown in interest within the scientific community. One such approach utilizes block copolymers for generating sub-optical ground rule patterns. In particular, one illustrative use is forming a 'honeycomb' structure, commonly referred to as a hexagonal closed packed structure, within a poly(methyl methacrylate-b-styrene) block copolymer. In the case of a cylindrical phase diblock having a minor component of polymethyl methaerylate (PMMA), the PMMA block can phase separate to form vertically oriented cylinders within the matrix of the polystyrene block upon thermal annealing.

The prior art process of using self-assembled block copolymers includes optionally coating a substrate with a random copolymer. This copolymer is affixed to the surface and excess material is removed. A self-assembled block copolymer is coated on the top surface of the random-substrate stack. The block copolymer is annealed with heat and/or in the presence of solvents, and/or actinic irradiation allowing for phase separation of immiscible polymer blocks. The annealed film is then developed by a suitable method such as immersion in a solvent that dissolves one polymer block and not the other, and reveals a pattern that is commensurate with the positioning of one of the blocks in the copolymer.

Since block copolymers have a natural length scale associated with their molecular weight and composition, the morphology of a phase-separated block copolymer can be tuned to generate cylinders of a specific width and on a specific pitch. Literature shows the use of UV exposure to cause the PMMA to decompose into smaller molecules and, further, developed using glacial acetic acid to remove the small molecules. Others simply develop the acetic acid to reveal a hexagonal close packed (HCP) pattern. A third possible development is using an oxygen plasma, which preferentially etches, for example, PMMA at a higher rate than polystyrene.

One prior art approach to an air bridge construction incorporates the dual damascene and block copolymer technologies mentioned above. Typically, the air bridge is constructed after the metal deposition steps that form the interconnects. For the purpose of reference, these types of processes are designated in the present application as Metal-then-Air Bridge (MAB) approaches consistent with the process sequence used. Most processes that follow this approach begin with the standard dual damascene fabrication sequence. After the metallization step and either before or after the dielectric capped deposition, a nanometer scale pattern is transferred into the underlying interconnect structure and capped with a barrier material. One disadvantage to this prior art approach is the exposure of the metallic lines to a harsh reactive ion etch process that is required for patterning of the interlevel dielectric material.

SUMMARY OF THE INVENTION

The present invention utilizes a block copolymer to form nanoscale patterns, e.g., nano-columnar voids, that may be transferred, e.g., etched, into an underlying material. In one aspect of the present invention, a method is provided that utilizes a block copolymer film to pattern a heterogeneous reflectivity surface, wherein the heterogeneous reflectivity surface dictates which portions of the overlying block copolymer are exposed by the application of a radiation. In one embodiment, the method includes:

providing a heterogeneous reflectivity surface;

forming a block copolymer atop the heterogeneous reflectivity surface;

segregating the block copolymer into first units and second units;

applying a radiation to the first units and second units, wherein the heterogeneous reflectivity surface produces an exposed portion of the first units and the second units;

applying a first development step to at least the exposed portion of the first units and the second units, the first development step removing a portion of the exposed portion of the second units to expose a portion of the heterogeneous reflectivity surface;

applying a second anneal to produce a spreading of a film of first units on the portion of the heterogeneous reflectivity surface exposed by the first development step; and applying a second development step to remove at least one of a remaining developed second unit to provide a pattern including at least one void.

In one embodiment of the method, the heterogeneous reflectivity surface overlies an interlevel dielectric layer including at least one conductive structure. In one embodiment, the heterogeneous reflectivity surface is provided by an upper surface of a cap dielectric layer that is positioned atop the upper surface of the interlevel dielectric layer and an upper surface of the at least one conductive structure. In one embodiment, the inventive method further includes transferring the pattern into the underlying interlevel dielectric layer.

In one embodiment of the inventive method, the step of applying the first anneal to the block copolymer to segregate the block copolymer into the first units and second units includes forming a hexagonal close packed matrix in which the first units provide the matrix and the second units provide a hexagonal close packed structure, which may have a columnar orientation. In one embodiment, in which the block copolymer is composed of polystyrene-block-polymethylmethacrylate (PS-b-PMMA), the first units are composed of polystyrene, and the second units are composed of methylmethacrylate (MMA). In one embodiment in which the block copolymer is composed of polystyrene-block-polymethylmethacrylate (PS-b-PMMA), the first units provide a matrix of polystyrene, and the second units are hexagonal close packed (HCP) structures of methylmethacrylate (MMA) that are dispersed throughout the matrix of polystyrene, wherein the hexagonal close packed (HCP) methylmethacrylate (MMA) may have a vertical columnar orientation.

In one embodiment, the step of applying the radiation to the first and second units includes applying an ultraviolet radiation (UV). In one embodiment, a block mask is applied to protect a portion of the first and second units before applying the radiation. In one embodiment, the block mask may be composed of photoresist.

In one embodiment in which the first units are composed of polystyrene (PS), the application of the ultraviolet radiation to the exposed portion of the first units induces cross-linking of the polystyrene matrix. In one embodiment in which the second units are composed of methylmethacrylate (MMA), the application of the ultraviolet radiation to the exposed portion of the second units decomposes a portion of the hexagonal close packed structures of methylmethacrylate (MMA).

In one embodiment, the application of the first development step to the exposed portion of the first and second units includes removing a portion of the exposed second units of methylmethacrylate (MMA), hence exposing an underlying portion of the heterogeneous reflectivity surface. In one embodiment, the developer applied during the first development step dissolves a portion of the decomposed second units of hexagonal packed structures of methylmethacrylate (MMA) to provide at least one void exposing the underlying portion of the heterogeneous reflectivity surface, wherein a remaining portion of the decomposed second units remain.

In one embodiment, the step of applying the second anneal to produce the grown film of first units on the portion of the heterogeneous reflectivity surface exposed by the first development step further includes spreading of the decomposed second units that are not dissolved during the first development step into hexagonal close packed structures. In one embodiment in which the first units are composed of polystyrene, the step of applying the second anneal produces a grown film of polystyrene on the portion of the heterogeneous reflectivity surface that was exposed when the decomposed second units of methylmethacrylate (MMA) were dissolved during the first development step. In one embodiment, the spreading of the decomposed second units that are not dissolved during the first development step includes forming seconds units of hexagonal close packed structures of methylmethacrylate (MMA), which may have a columnar orientation. Spreading of the polymer film means that when the polymer is exposed to the light the PMAA degrades, wherein the remaining material can fill the void left by the degraded material.

In one embodiment, applying the second development step to remove at least one of the remaining developed second units to produce the pattern includes dissolving at least one of the remaining decomposed second units spread into hexagonal close packed structures of methylmethacrylate (MMA) during the second anneal step. In one embodiment, the pattern produced by the second development step includes a plurality of voids overlying a portion of the heterogeneous reflectivity surface, wherein each of the voids may have a width ranging from about 5 nm to about 200 nm. In another embodiment, the pattern produced by the second development step includes a plurality of voids overlying a portion of the heterogeneous reflectivity surface, wherein each of the voids may have a width ranging from about 5 nm to about 100 nm.

In another aspect of the present invention, a method of patterning a surface is provided by a block copolymer layer that may be selectively segregated, wherein controlling the thickness of the block copolymer layer dictates the portions of the block copolymer layer in which segregation is desired. In one embodiment, the method includes:

providing an interlevel dielectric layer comprising at least one conductive structure having an upper surface recessed to a depth below an upper surface of the interlevel dielectric layer;

forming a block copolymer atop the upper surface of the at least one conductive structure and atop the upper surface of the interlevel dielectric layer, wherein a first thickness of the block copolymer atop the at least one conductive structure is greater than a second thickness of the block copolymer atop the interlevel dielectric layer;

segregating the block copolymer having the second thickness into a heterogeneous layer of first units and second units, wherein the block copolymer having the first thickness remains homogeneous;

removing at least one of the first units or the second units to provide a pattern; and transferring the pattern into the interlevel dielectric layer.

In one embodiment, the vias provided by the removal of the first or second units of the heterogeneous layer provide a pattern that may be transferred into the underlying interlevel dielectric layer, wherein the homogeneous portion of the block copolymer remains to protect a portion of the underlying structure, such as the conductive structure.

In one embodiment when the block copolymer is composed of polystyrene-block-polymethylmethacrylate (PS-b-PMMA), the block copolymer layer positioned atop the interlevel dielectric layer (second thickness) that may segregate into the heterogeneous layer of first and second units may have a thickness that ranges from about 5 nm to about 200 nm, wherein the thickness (H) of the block copolymer provides an integer value entered in the following equation:

$$\text{Integer} = H/L_o$$

wherein $L_o$ is a natural periodicity for block copolymer phase separation and ranges from about 40 nm to about 120 nm. It is noted that smaller periodicities have been contemplated, so long as the periodicity is not too small to permit separation of the diblock, in accordance with the present invention.

In one embodiment, the depth that the upper surface of the conductive structure is recessed below the upper surface of the interlevel dielectric level may range from about ⅓ to about ¾ of the thickness of the block copolymer periodicity atop the interlevel dielectric layer. In one embodiment, the thickness of the block copolymer layer atop the recessed surface that of the at least one conductive structure that provides the homogeneous portion of the block copolymer layer is equal to or greater than the thickness of the block copolymer atop the interlevel dielectric layer plus the depth that the upper surface of the at least one conductive structure has been recessed.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1A:
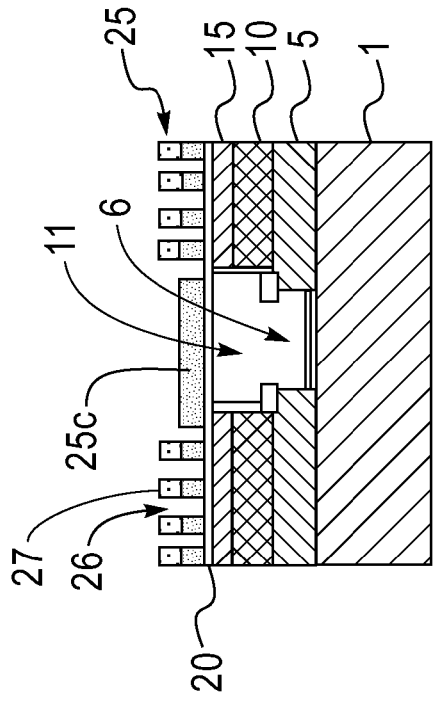
FIGS. 1A-1D are pictorial representations (through cross sectional side views) depicting processing steps employed in one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel patterning methods and related structures for microelectronic devices. When describing the inventive structures and methods, the following terms have the following meanings, unless otherwise indicated.

As used herein, the terms "insulating" and/or "dielectric" denote a material having a room temperature conductivity of less than about $10^{-10}(\Omega\text{-m})^{-1}$.

"Electrically conductive" as used through the present disclosure means a material typically having a room temperature conductivity of greater than $10^{-8}(\Omega\text{-m})-1$.

As used herein, a "metal" is an electrically conductive material, wherein in metal atoms are held together by the force of a metallic bond; and the energy band structure of metal's conduction and valence bands overlap, and hence, there is no energy gap.

As used herein, a "copolymer" is a polymer composed of two or more dissimilar mer units in combination along its molecular chain.

As used herein, the term "block copolymer" means a copolymer in which the mer units of each block have a repeating subunit that are linked by covalent bonds. Block copolymers with two or three distinct blocks are called diblock copolymers and triblock copolymers, respectively. Block copolymers may have more than three distinct blocks.

As used herein, the term "hexagonal close packed structure" means a unit cell that contains three layers of atoms. The top and bottom layers containing six atoms at the corners of a hexagon and one atom at the center of each hexagon. The middle layer contains three atoms between the atoms of the top and bottom layers.

As used herein, the term "vertical columnar orientation" refers to cylindrical domain diblock copolymers where the cylinders are orientated substantially normal to the surface.

The term "crosslink" denotes a condition by which a polymer is covalently linked in a network, wherein the polymer chains are linked randomly amongst adjacent polymers.

As used throughout the present disclosure, the terms "decompose" and/or "decomposed" refer to cleavage of the polymer units into lower molecular weight components.

As used herein, the terms "dissolve" and/or "dissolved," mean the action or state of becoming a solution. In one embodiment, the solution is a liquid solution.

As used herein, the term "heterogeneous reflectivity surface" means surface with two or more distinct regions of reflectivity. In one embodiment, the reflectivity of the different portions of the heterogeneous reflectivity surface correspond to an underlying surface.

The term "air bridge" is used to describe an interconnect structure in which a void volume extends and occupies substantial contiguous regions having a volume ranging from about 0% to about 100% of the space between lines of an interconnect structure, in which the lines are nominally separated by a solid dielectric, wherein an air bridge is distinguished from structures in which the dielectric separating the lines includes pores having a diameter ranging from about <1 nm to about 100 nm.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the figures. Further, it will be understood that when an element as a layer, region or substrate is referred to as being "atop" or "over" or "overlying" or "below" or "underlying" another element, it can be directly on the other element or intervening elements may also be present. In contrast, when an element is referred to as being "directly on" or in "direct physical contact" with another element, there are no intervening elements present.

FIGS. 1A-1D depict a process sequence for one embodiment of the present invention. FIG. 1A illustrates an initial structure that may include a substrate 1; a via level dielectric 5 atop the substrate 1; a line level dielectric 10 atop the via level dielectric 5; an optional hard mask 15 atop the line level dielectric 10; a dielectric cap 20 atop the upper surface of the hard mask 15, or atop the line level dielectric 10 when the hard mask 15 is omitted; and a block copolymer layer 25 positioned atop the dielectric cap 20. In one embodiment, the via level dielectric 5 contains a first conductive structure 6, i.e., metal stud. In one embodiment, the line level dielectric 10 contains at least a portion of a second conductive structure 11, i.e., metal line.

In one embodiment, the substrate 1 may include any number of active and/or passive devices (or regions) located within the substrate or on a surface thereof. For clarity, the active and/or passive devices (or regions) are not shown in the drawings, but are nevertheless meant to be included with substrate 1. The substrate 1 may be composed of any semiconductor material including, but not limited to: Si, Ge, SiGe, SiC, SiGeC, InAs, GaAs, InP and other III/V compound semiconductors. Layered semiconductors such as silicon on insulators are also being contemplated as a possible candidate for substrate. The substrate 1 may be undoped, or doped. In one example, the doping of Si-containing substrate may be light (having a dopant concentration of less than 1E17 atoms/cm$^3$) or heavy (having a dopant concentration of about 1E17 atoms/cm$^3$ or greater). The substrate 1 can have any crystallographic orientation such as (100), (110) or (111). Hybrid substrates having at least two planar surfaces of different crystallographic orientation are also contemplated. It is noted that the present method although described in the present disclosure as being suitable for microelectronics has numerous other applications. For example, the methods disclosed herein are suitable for forming micro-fluidic devices, such as micro-fluidic devices as used in DNA sequencing or combintoril chemistry.

In one embodiment, the via level dielectric 5 and the line level dielectric 10 may include single or multiphase dielectric materials selected from the group consisting of silicon-containing materials such as amorphous hydrogenated silicon ($\alpha$-Si:H), $SiO_2$, SiN, $SiO_xN_y$, SiC, SiCO, SiCOH, and SiCH compounds, these silicon-containing materials with some or all of the Si replaced by Ge, inorganic oxides, inorganic polymers, organic polymers such as polyimides, other carbon-containing materials, organo-inorganic materials such as spin-on glasses, diamond-like carbon (DLC, also known as amorphous hydrogenated carbon, $\alpha$-C:H) with or without one or more additives selected from the group containing F, N, O, Si, Ge, metals and nonmetals. Additional choices for one or more of the via dielectric level 5 and line level dielectric 10 include any of the aforementioned materials in porous form, or in a form that changes during processing from porous and/or permeable to non-porous and/or non-permeable or vice versa.

In one embodiment, the via level dielectric 5 and the line level dielectric 10 may be formed by a deposition process including, but not limited to: spinning from solution, spraying from solution, chemical vapor deposition (CVD), plasma enhanced CVD (PECV)), sputter deposition, reactive sputter deposition, ion-beam deposition, evaporation, and combinations thereof.

In one embodiment, a hard mask 15 may be formed and on the line level dielectric 10. The hard mask 15 may comprise one or more layers of one or more materials, such as oxides, nitrides, oxynitrides or a combination thereof. In one embodiment, the hard mask 15 may include $SiO_2$ having a thickness being less than 5 nm, wherein in one embodiment the thickness may range from about 5 nm to about 500 nm. In another embodiment, the hard mask 15 may comprise of a nitride/oxide bilayer with a thin $Si_2N_4$ layer below a thicker $SiO_2$ layer, or any of a variety of carbon-based materials also containing silicon. The hard mask 15 may be formed using a deposition process such as chemical vapor deposition (CVD), plasma-assisted CVD, evaporation and/or chemical solution deposition, or may be formed using a thermal growth process, such as oxidation, nitridation, and oxynitridation. The hard mask 15 may be optional, and although the figures depict the presence of the hard mask 15, embodiments of the present invention include where the hard mask 15 is omitted.

In one embodiment, the first conductive structure 6, i.e., metal stud, and second conductive structure 11, i.e., metal line, may be formed from various combinations of conductive adhesion layers, diffusion barriers, and high-conductivity metals. Components of the first and second conductive structures 6, 11 may include barrier and adhesion layers, such as doped semiconductors, metal nitrides, conductive metal oxides, metal silicon nitrides, metal silicides, and metals, and alloys, mixtures and multilayers of the aforementioned materials. In one embodiment, the conductive materials for the first conductive structure 6 and/or second conductive structure 11 may include, but are not limited to: W, Cu, Au, Ag, Ta, Ni, Co, NiP, CoP, Cr, Pd, TaN, TiN, TaSiN, TiAlN, Al, AlCu and alloys thereof.

In one embodiment, the first conductive structure 6, i.e., metal stud, and the second conductive structure 11, i.e., metal line, may be formed using a damascene process. In one embodiment of a damascene process, metal patterns inset in a layer of dielectric are formed by the steps of etching holes, i.e., vias, in the via level dielectric 5, and trenches into the line level dielectric 10; lining the holes and/or trenches with one or more adhesion and/or diffusion barrier layers; overfilling the holes or trenches with a conductive material; and removing the metal overfill by a planarizing process such as chemical mechanical polishing (CMP). In another embodiment, the damascene process may be simplified by using a process variation known as dual damascene, in which patterned cavities for the wiring level and its underlying via level are filled in with metal in the same deposition step. In one embodiment of the dual damascene variation, a dual-relief pattern is utilized to provide the holes, i.e., vias, in the via level dielectric 5, and the trenches in the line level dielectric 10. In one embodiment, the hard mask 15 provides for etch selectivity during etch steps to provide the holes and vias, and functions as a polish stop during planarization.

In one embodiment, following planarization, a dielectric cap 20 is formed atop at upper surface of the second conductive structure 11 and the hard mask 15 when present, or atop the line level dielectric 10 when the hard mask 15 is omitted. The dielectric cap 20 may be composed of silicon-containing materials such as amorphous hydrogenated silicon (α-Si:H), $SiO_2$, SiN, $SiO_xN_y$, SiC, SiCN, SiCO, SiCOH, and SiCH compounds. In one embodiment, the thickness of the dielectric cap 20 may range from about 3 nm to about 1000 nm. In one embodiment, the dielectric cap 20 may be formed by chemical vapor deposition, or plasma enhanced chemical vapor deposition.

In one embodiment, the upper surface of the dielectric cap 20 has a heterogeneous reflectivity. Reflectivity is the fraction of incident radiation reflected by a surface. A heterogeneous reflectivity surface is a surface in which the reflectivity of the surface varies depending upon the composition of the underlying structure. In one embodiment, the heterogeneous reflectivity surface results from the heterogeneous composition of the underlying interconnect structure, i.e., line level dielectric 10 and second conductive structure 11, that is produced by the damascene process. In one embodiment, the reflectivity of the upper surface overlying the second conductive structure 11 ranges from 100% to 0%, and the reflectivity of the surface overlying the line level dielectric 10 ranges from 0% to 100%.

Still referring to FIG. 1A, in one embodiment, a block copolymer layer 25, such as a self-assembling block copolymer, is positioned on either the optional hard mask 15 or the dielectric cap 20. In some embodiments, (not shown) an optional random copolymer can be formed prior to forming the block copolymer. A random copolymer is a polymer containing two or more units that are statistically distributed along the polymer chain. In one embodiment, the optional random copolymer may have a thickness ranging from about 1 nm to about 1000 nm. It is noted that greater thickness have been contemplated. For example, in a PS-B-PMAA system the optional random copolymer may have a thickness on the order of about 70 Å.

In one embodiment, the block copolymer layer 25 may be of a self-assembled block copolymer that is annealed to form an ordered pattern containing repeating structural units. There are many different types of block copolymers that can be used for practicing the present invention, as long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions. In one embodiment of the present invention, the block copolymer layer 25 includes a first polymeric block component and second polymeric block component, i.e, first unit 25a and second unit 25b, which are immiscible with each other. Hereafter, first polymeric block component (first unit 25a) and second polymeric block component (second unit 25b) of the block copolymer layer 25 are interchangeably referred to as block component A and a block component B.

In one embodiment, the block copolymer layer 25 may contain any numbers of the polymeric block components A and B arranged in any manner. For example, the block copolymer layer 25 can have either a linear or a branched structure. In one embodiment, the block copolymer is a linear diblock copolymer having the formula of A-B. Further, the block copolymer can have any one of the following formula:

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. In one embodiment, the molecular weight ratio between the first and second polymeric block components A and B can be adjusted in the block copolymer of the present invention, in order to form structural units of a desired geometry. For example, when the ratio of the molecular weight of the first polymeric block component A, i.e., a first unit 25a composed of polystyrene, over the molecular weight of the second polymeric block component B, i.e., second unit 25b composed of methylmethacrylate (PMMA), is greater than about 80:20, the block copolymer will form an ordered array of spheres composed of the second polymeric block component B, i.e., the second unit 25b being composed of methylmetacrylate (PMMA), in a matrix composed of the first polymeric block component A, i.e., the first unit 25a being composed of polystyrene (PS).

In another example, when the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. In another example, when the ratio of the molecular weight of the first polymeric block component A over the molecular weight of the second polymeric block component B is less than about 72:28 but greater than about 33:67, the block copolymer will form an ordered array of cylinders composed of the second polymeric block component B in a matrix composed of the first polymeric block component A.

In further example, when the ratio of the molecular weight of the first polymeric block component A over the molecular weight of the second polymeric block component B is less than about 60:40 but is greater than about 40:60, the block copolymer will form alternating lamellae composed of the first and second polymeric block components A and B.

In yet another example, the ratio of the molecular weight of the first polymeric block component A over the molecular weight of the second polymeric block component B ranges from about 80:20 to about 60:40, so that the block copolymer will form an ordered array of lines composed of the second polymeric block component B in a matrix composed of the first polymeric block component A.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, lines, cylinders, or lamellae), as described hereinabove.

In order to form the self-assembled periodic patterns, the block copolymer is first dissolved in a suitable solvent system to form a block copolymer solution, which is then applied onto a surface to form a block copolymer layer 25, followed by annealing of the block copolymer layer 25, thereby effectuating phase separation between different polymeric block components, i.e., first and second units 25a, 25b, contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. In one embodiment, the block copolymer solution contains the block copolymer at a concentration ranging from about 0.1% to about 2% by total weight of the solution. In another embodiment, the block copolymer solution contains the block copolymer at a concentration ranging from about 0.5 wt % to about 1.5 wt %. In a Her embodiment, the block copolymer solution is composed of about 0.5 wt % to about 1.5 wt % PS-b-PMMA dissolved in toluene or PGMEA.

The block copolymer solution can be applied to the heterogeneous reflectivity surface of the dielectric cap 20 by any suitable technique, including, but not limited to: spin casting, coating, spraying, ink coating, dip coating, and combinations thereof In one embodiment, the block copolymer solution is spin cast onto the heterogeneous reflectivity surface of the dielectric cap 20 to form a block copolymer layer 25 thereon. In one embodiment, the thickness of the block copolymer layer equal to the molecular weight of the block copolymer raised to about ⅔ to about 1 power.

After application of the block copolymer layer 25 onto the heterogeneous reflectivity surface, the entire structure is annealed to effectuate at least micro-phase segregation of the different block components contained by the block copolymer, thereby forming the periodic patterns with repeating structural units, i.e., first units 25a and second units 25b, as depicted in FIG. 1A.

The annealing of the block copolymer layer 25 can be achieved by various methods including, but not limited to: thermal annealing (either in a vacuum or in an inert atmosphere containing nitrogen or argon), ultra-violet annealing, laser annealing, solvent vapor-assisted annealing (either at or above room temperature), supercritical fluid-assisted annealing and combinations thereof.

In a one embodiment of the present invention, a first annealing step is carried out to segregate the block copolymer layer 25 at an annealing temperature that is above the glass transition temperature ($T_g$) of the block copolymer, but below the decomposition or degradation temperature ($T_d$) of the block copolymer. In one embodiment, the thermal annealing step is carried out with an annealing temperature ranging from about 200° C. to about 300° C. In one embodiment, the thermal annealing may last from less than about 1 hour to about 100 hours, and more typically from about 1 hour to about 15 hours. In another embodiment, the thermal annealing may last about 30 minutes to about 15 hours. In another embodiment, solvent annealing may be employed, wherein a chemical solvent is utilized to drop the glass transition temperature ($T_g$) of the block copolymer in order to anneal at room temperature.

In one embodiment in which the block copolymer layer 25 is composed of polystyrene-block-polymethylmethacrylate (PS-b-PMMA), the step of applying the first anneal to the block copolymer layer 25 to segregate the block copolymer into the first units 25a and the second units 25b includes forming a hexagonal close packed matrix in which the first unit 25a provides the matrix and the second unit 25b provides a hexagonal close packed structure having a columnar orientation. In one embodiment, the hexagonal packed structure is composed of methylmethacrylate (MMA) and the matrix is provided by polystyrene.

Figure 1B:
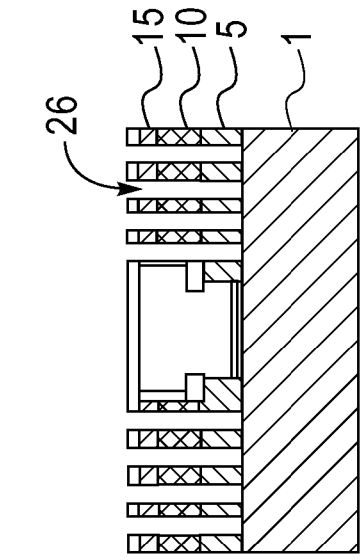

Referring now to FIG. 1B, in one embodiment, the segregated block copolymer layer 25 is then exposed, developed, annealed and developed again to reveal a convolved pattern composed of the self-assembled di-block morphology having a pattern commensurate with the delivered exposure dose. The term convolved as used herein means that the pattern of the segregated block copolymer layer 25 corresponds, i.e., mimicks, the underlying surface, such as the underlying substrate. Although, the following example is directed to a copolymer film 25 composed of polystyrene-block-polymethylmethacrylate (PS-b-PMMA), it is noted that other copolymers, such as the compositions described above, are suitable for the present method and are intended to be within the scope of the present invention. The example directed to a copolymer film 25 composed of polystyrene-block-polymethylmethacrylate (PS-b-PMMA) is provided for illustrate purposes and is not intended to limit the scope of the invention.

In one embodiment, following segregation of the block copolymer layer 25 into the first and second units 25a, 25b, the segregated block copolymer layer 25 is exposed by applying a radiation to the first units 25a and second units 25b, wherein the heterogeneous reflectivity surface provides an exposed portion of the first units 25a and the second units 25b. In one embodiment in which a copolymer film of polystyrene-block-polymethylmethacrylate (PS-b-PMMA) is segregated into a plurality of second units 25b composed of HCP MMA having a columnar orientation in a matrix of first units 25a composed of polystyrene, application of radiation to the heterogeneous reflectivity surface exposes only a portion of the first units 25a and second units 25b corresponding to the dielectric and conductive materials underlying the heterogeneous reflectivity surface. In one embodiment, in which a block copolymer layer 25 of polystyrene-block-polymethylmethacrylate (PS-b-PMMA) is segregated into a plurality of second units 25b composed of HCP MMA in a matrix of first units 25a composed of polystyrene, the radiation applied during the exposure step is of an ultraviolet spectrum. In one embodiment, the spectrum of the ultraviolet radiation ranges from about 130 nm to about 450 nm.

In one embodiment in which a copolymer film of polystyrene-block-polymethylmethacrylate (PS-b-PMMA) is segregated into a plurality of second units 25b composed of HCP methylmethacrylate (MMA) in a matrix of first units 25a composed of polystyrene, the step of applying the radiation includes applying an ultraviolet radiation that decomposes a portion of the exposed second units 25b of HCP (methylmethacrylate) MMA and induces crosslinking in the first units of the polystyrene matrix In one embodiment, a portion of the second units 25b composed of HCP methylmethacrylate (MMA) that are exposed to radiation do not decompose. In one embodiment, a block mask (not shown) is formed protecting a portion of the first units 25a and second units 25b before applying the radiation, wherein the block mask may be composed of photoresist.

In one embodiment, following the exposure step, one of the segregated components of the block copolymer layer 25, can be removed by utilizing a first development step with a solvent that is selective to one component of the exposed and segregated block copolymer layer 25 relative to the other component. In one embodiment, in which the block copolymer layer 25 is composed of polystyrene-block-polymethylmethacrylate (PS-b-PMMA), the first development step removes a portion of the decomposed hexagonal close packed methylmethacrylate (MMA) having a columnar orientation selective to the matrix of first units provided by polystyrene. The type of solvent may vary and can be, for example, selected from the following list: polar and aprotic solvents.

In one embodiment, the application of the first development step to the exposed portion of the first units 25a and the second units 25b includes removing a portion of the exposed second units 25b of methylmethacrylate (MMA), hence exposing an underlying portion of the heterogeneous reflectivity surface. In one embodiment, the developer applied during the first development step dissolves a portion of the decomposed second units 25b of hexagonal packed structures of methylmethacrylate (MMA) to provide a void exposing the underlying portion of the heterogeneous reflectivity surface, wherein a remaining portion of the decomposed second units 25b remain. In one embodiment, during the application of the developer to the segregated copolymer film 25, prior to decomposition the methylmethacrylate (MMA) component migrates to the top surface of the styrene matrix when exposed to developer.

Still referring to FIG. 1B, following the first development step, a second anneal is applied to the exposed and developed segregated block copolymer layer 25 to produce a spread film of first units 25c on the portion of the heterogeneous reflectivity surface from which the decomposed second units 25b where dissolved during the first development step, in accordance with one embodiment of the present method. In one embodiment, the spread film of first units 25c is formed overlying the conductive structure, i.e., first conductive structure 6 and second conductive structure 11, and protects the conductive structure during subsequent etch processes. In one embodiment, the step of applying the second anneal further includes spreading the decomposed second units that remain following the first development step into the hexagonal close packed structures of methylmethacrylate (MMA) having the columnar orientation. In one embodiment, similar to the first anneal, the second anneal may include, but is not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing. In a one embodiment of the present invention, the second annealing step is carried out with an annealing temperature of about 200° C. to about 300° C. In one embodiment, the thermal annealing may last from less than about 1 hour to about 100 hours. In another embodiment, the thermal annealing may last from about 1 hour to about 15 hours.

In one embodiment, the step of applying the second development step to remove at least one of the remaining developed second units to provide a pattern having at least one void 26 includes dissolving at least one of the remaining decomposed second units that have spread during the second annealing step into hexagonal close packed structures of methylmethacrylate (MMA). In one embodiment, the spread hexagonal close packed structures have a columnar orientation. In one embodiment, the at least one void overlying the exposed portion of the heterogeneous reflectivity surface has a width ranging from about 3 nm to about 200 nm. In one embodiment, the second development step removes at least one of a remaining developed second unit to provide at least one void overlying an exposed portion of the heterogeneous reflectivity surface, wherein the void has a width of about 50 nm or less. In another embodiment, the void has a width ranging from about 10 nm to about 40 nm. In another embodiment, the void has a columnar geometry.

Figure 1C:
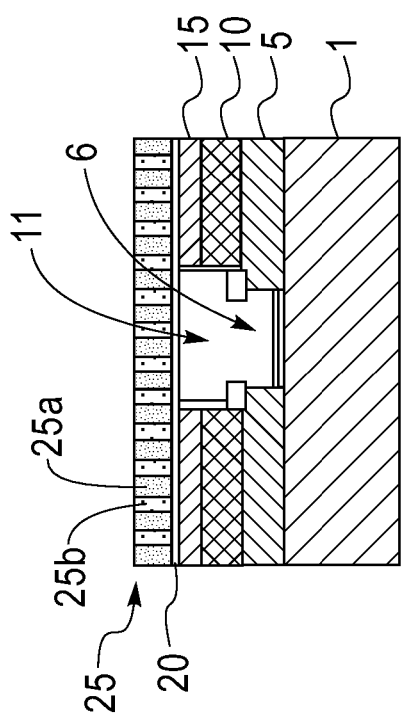
Figure 1D:
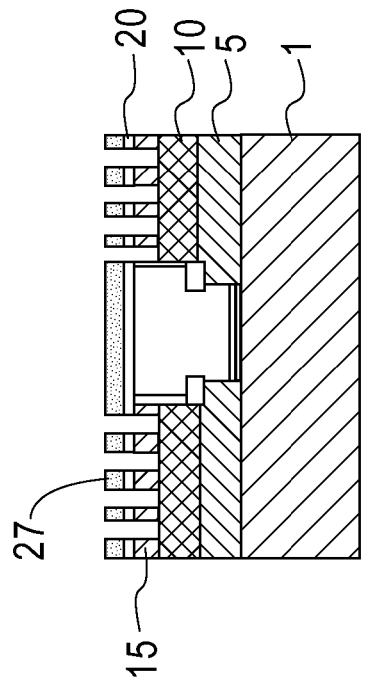

Referring to FIGS. 1C and 1D, after removing the developed second unit to provide at least one void 26, the remaining first units 25a of the segregated block copolymer layer 25 provide a pattern 27, which may also be referred to as an etch mask. In one embodiment, the pattern is a nano-scaled pattern in which the dimension of the pattern may range from about 10 nm to about 20000 nm. Typically, etching is performed utilizing a dry etching process such as, for example, reactive ion etching, ion beam etching, plasma etching, laser ablation or a combination thereof. Since self-assembled polymer technology is used in the inventive process, the width, W, of each void 26 separating the first units 25a that provide the pattern 27 is less than 50 nm, with a width from about 10 to about 40 nm being more typical.

In one embodiment, the pattern 27 of first units 25a may then be used to perforate the cap dielectric 20 and the optional hard mask layer 15, as shown in FIG. 1C. In one embodiment, the pattern 27 can then be transferred into the interlevel dielectrics, i.e., line level dielectric 15 and via level dielectric 10, as shown in FIG. 1D.

FIGS. 2A-2D depict the process flow of another embodiment of the present invention, in which a block mask 30 is utilized to protect regions of the block copolymer layer 25 during exposure that would not be protected through the self-alignment exposure mechanisms that are dictated by the heterogeneous reflectivity surface, as described above with reference to FIGS. 1A-1D.

Figure 2A:
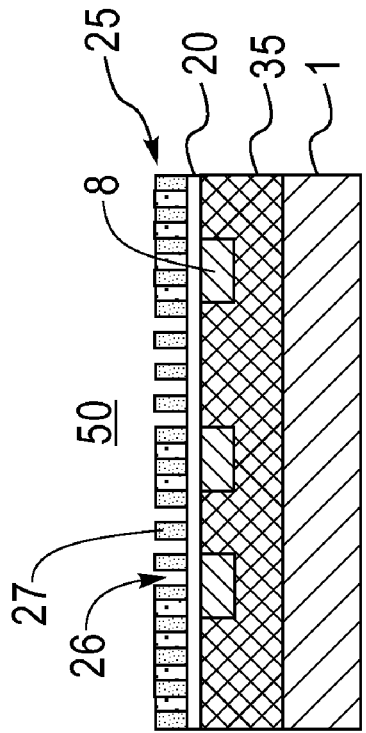
FIGS. 2A-2D are pictorial representations (through cross sectional side views) depicting processing steps that are employed in another embodiment of the present invention.

FIG. 2A depicts a block copolymer layer 25 that has been coated on an initial structure that may include a heterogeneous reflectivity surface and has annealed to segregate the block copolymer layer 25 into first units 25a and second units 25b. In one embodiment, similar to the embodiment described with reference to FIGS. 1A-1D, the initial structure may include an interlevel dielectric 35 having at least one conductive structure 8, i.e., metal stud or metal line; an optional hard mask (not shown), and a dielectric cap 20. In one embodiment, the initial structure depicted in FIG. 2A is provided by a single or dual damascene process.

In one embodiment, similar to the embodiment described with referenced to FIG. 1A-1D, the block copolymer layer 25 may include a first and second polymeric block components, i.e, first unit 25a and second unit 25b, which are immiscible with each other. In one embodiment when the block copolymer layer 25 includes polystyrene-block-polymethylmethacrylate (PS-b-PMMA), the block copolymer layer 25 may be segregated into a first unit 25a comprising polystyrene and a second unit 25b comprising methylmethacrylate (MMA).

In one embodiment, annealing of the block copolymer layer 25 to segregate the copolymer film 25 into first 25a and second units 25b may include, but is not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing. In a one embodiment of the present invention, the second annealing step is carried out to segregate the block copolymer layer 25 at an elevated annealing temperature that is above the glass transition temperature ($T_g$) of the block copolymer, but below the decomposition or degradation temperature ($T_d$) of the block copolymer. In one embodiment, the thermal annealing step is carried out with an annealing temperature of about 200° C. to about 300° C. In one embodiment, the thermal annealing may last from less than about 1 hour to about 100 hours. In another embodiment, the thermal annealing may last from about 1 hour to about 15 hours.

Figure 2B:
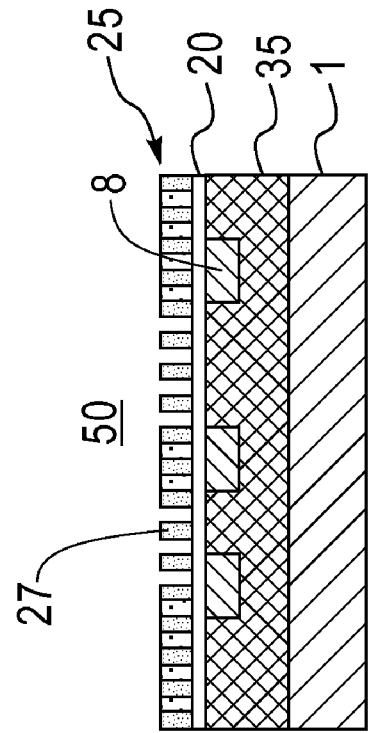

FIG. 2B depicts forming a block mask 30 atop the segregated block copolymer layer 25 and then applying a radiation (exposure), wherein the segregated block copolymer layer 25 is exposed through the block mask 30. In one embodiment, forming the block mask 30 may include depositing a layer of photoresist atop the structure; exposing the photoresist to a pattern of radiation; and then developing the pattern into the photoresist utilizing a resist developer. The exposed regions of the device are then processed while the regions underlying the block mask 30 are protected.

In one embodiment, following the formation of the block mask 30, a radiation (depicted by the arrows in FIG. 2B) is applied to the exposed portions 50 of the segregated block copolymer layer 25. Similar to the embodiment described above with reference to FIGS. 1A-1D, the radiation may be of the ultraviolet spectrum. In one embodiment, the radiation may be below approximately 450 nm. In one embodiment, the radiation dose is sufficient so that substantially all of the exposed regions 50 will get a sufficient exposure to cause a reaction across the entire exposed region, wherein the layer may be developed to provide a nano-scaled pattern 27, as shown in FIG. 2E.

Figure 2C:
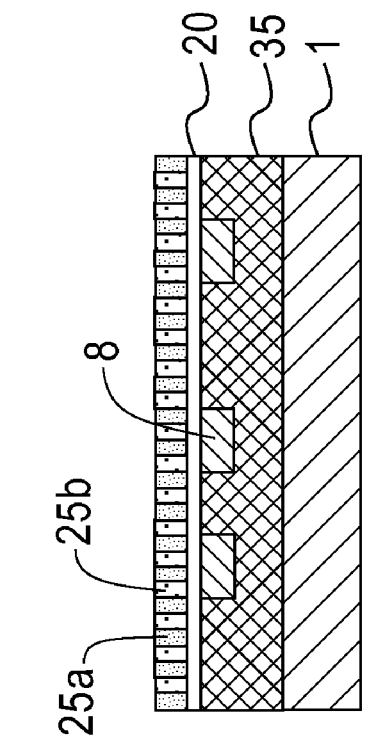

In one embodiment, the radiation dose is selected to overcome the selectivity of exposure provided by the heterogeneous reflectivity surface. In one embodiment, in which the copolymer film is composed of polystyrene-block-polymethylmethacrylate (PS-b-PMMA), a radiation dose to the exposed portion 50 of the segregated copolymer film 25 provided by the block mask 30 provides an exposed film in which one type of unit, such as the second units 25b of methylmethacrylate (MMA), can be remove in their entirety to provide a void 26 during a subsequent development process, and that the remaining type of units, such as the first units 25a of polystyrene, may remain to provide a pattern 27, such as a nano-scaled pattern, as depicted in FIG. 2C.

Figure 2D:
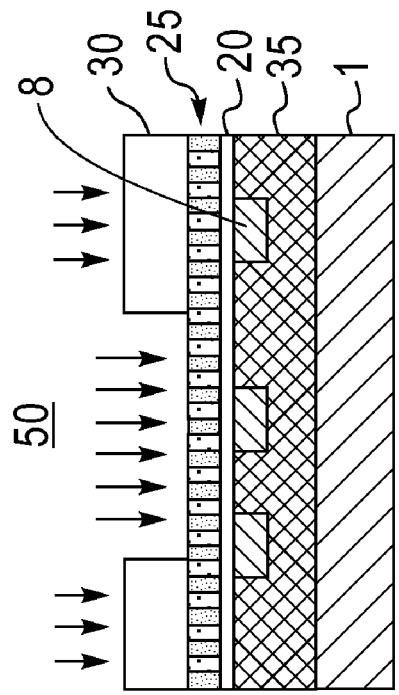

In another embodiment, the radiation dose is selected to allow for the selective exposure mechanisms that are provided by the heterogeneous reflectivity surface, which are described above with reference to FIGS. 1A-1D. In one embodiment, in which the copolymer film 25 is composed of polystyrene-block-polymethylmethacrylate (PS-b-PMMA), a radiation dose of about 50 mJ to about 2 J to the portion 50 of the segregated copolymer film 25 exposed by the block mask 30 provides a selectively exposed film in which a first portion of second unit 25b, such as methylmethacrylate (MMA), can be removed and a remaining portion of the second unit 25b that is exposed may remain following subsequent development process, as well as the first units 25a that may be composed of polystyrene, to provide a pattern 27, such as a nano-scaled pattern, as depicted in FIG. 2D.

In one embodiment, following the exposure of the segregated copolymer film, a development process is applied that may include a first development step followed by a second anneal step, which is then followed by a second development step, as described above with reference to FIG. 1B. In one embodiment, the step of applying the development cycle removes at least one of the exposed second units 25b to provide at least one void 26. In one embodiment, the at least one void 26 overlying the exposed portion of the heterogeneous reflectivity surface has a width of about 50 nm or less. In another embodiment, the void 26 has a width ranging from about 10 nm to about 40 nm. In another embodiment, the void 26 has a columnar geometry.

In a following process step, the first units 25a and remaining second units 25b when present of the copolymer film 25 provide a pattern 27 that may serve as an etch mask for the underlying interlevel dielectric 35. Typically, etching is performed utilizing a dry etching process such as, for example, reactive ion etching, ion beam etching, plasma etching or laser ablation.

Figure 3D:
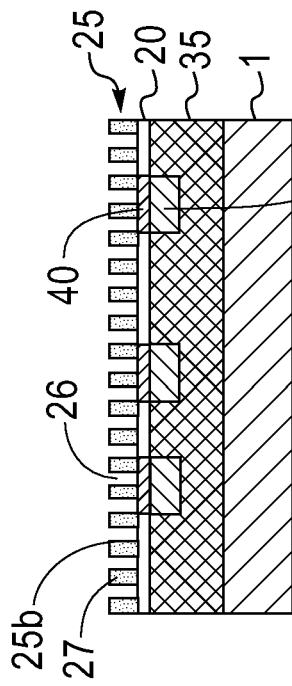
FIGS. 3A-3E are pictorial representations (through cross sectional side views) depicting processing steps that are employed in a further embodiment of the present invention.
Figure 3E:
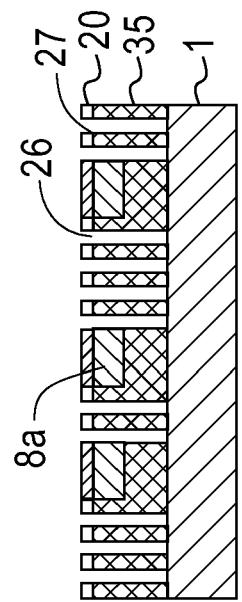
Figure 3A:
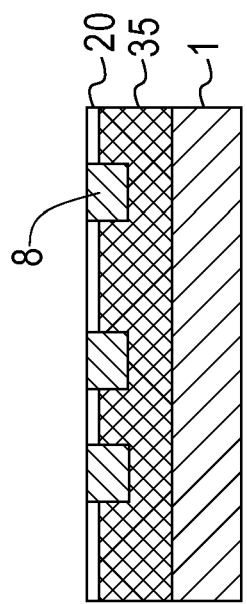

FIGS. 3A-3E depict another embodiment of the present invention, in which the thickness of the block copolymer layer 25 is selected to induce segregation of the block copolymer layer 25 into first units 25a and second units 25b over pre-selected portions of the substrate 1. FIG. 3A depicts an initial structure that may be utilized in accordance with this embodiment of the present invention, wherein the initial structure may include an interlevel dielectric layer 35 having at least one conductive structure 8, such as a metal stud or metal line; an optional hard mask (not shown), and a dielectric cap 20. The dielectric cap 20 and/or optional hard mask may serve as the bridge for a subsequently formed air bridge.

Figure 3B:
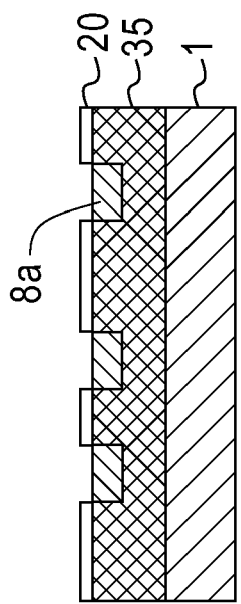

In one embodiment, the upper surface of the conductive structure 8 is recessed to a depth below an upper surface of the dielectric cap 20, as depicted in FIG. 3B. In one embodiment, the upper surface of the at least one conductive structure 8 is recessed by an etch step, such as an anisotropic etch, i.e., reactive ion etch. In one embodiment, the upper surface of the conductive structure 8 is recessed by an etch process that removes the material of the conductive structure 8 selective to the composition of the interlevel dielectric layer 35. In one embodiment, the upper surface of the conductive structure 8 is recessed by a wet etch that removes the material of the conductive structure 8 selective to the composition of the interlevel dielectric layer 35.

Figure 3C:
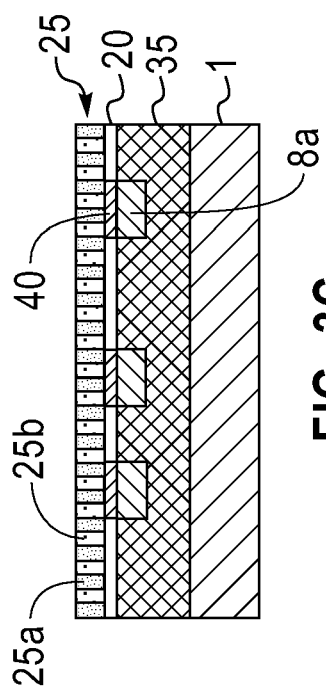

Referring to FIG. 3C, in one embodiment, following recessing of the upper surface of the conductive structure 8a a block copolymer layer 25 is formed atop the upper surface of the recessed conductive structure 8a and atop the upper surface of the interlevel dielectric layer 35, wherein the thickness $T_1$ of the block copolymer layer 25 atop the recessed conductive structure 8a is greater than the thickness of the block copolymer layer 25 atop the interlevel dielectric 35. In one embodiment, similar to the embodiment described with referenced to FIG. 1A-1D, the block copolymer layer 25 may include a first and second polymeric block components, i.e, first unit 25 a and second unit 25b, which are immiscible with each other. In one embodiment when the block copolymer layer 25 includes polystyrene-block-polymethylmethacrylate (PS-b-PMMA), the block copolymer layer 25 may be segregated into a first unit 25a comprising polystyrene and the second unit 25b comprising methylmethacrylate (MMA).

In one embodiment, the thickness of the block copolymer layer 25 atop the interlevel dielectric layer 35 is selected to provide a copolymer that segregates into a heterogeneous layer of first units 25a and second units 25b. In one embodiment in which the block copolymer is composed of polystyrene-block-polymethylmethacrylate (PS-b-PMMA), the thickness of the block copolymer layer 25 is selected to provide that the block copolymer layer 25 be segregated into a first unit 25a comprising polystyrene (PS) and a second unit 25b comprising polystyrene methylmethacrylate (MMA). In one embodiment in which the block copolymer is composed of polystyrene-block-polymethylmethacrylate (PS-b-PMMA), the thickness of the block copolymer layer 25 atop the interlevel dielectric layer 35 is selected to provide an integer value when entered into the following equation (hereafter referred to as Equation 1):

Integer=H/Lo wherein (H) is the thickness of the block copolymer layer 25 and Lo is a natural periodicity for the block copolymer phase separation. The Lo value for a block copolymer composed of polystyrene-block-polymethylmethacrylate (PS-b-PMMA) ranges from 40 nm to 120 nm.

In one embodiment, the thickness of the block copolymer layer 25 atop the recessed surface of the conductive structure 8 is selected so that the copolymer does not segregate and instead provides a homogeneous composition 40 atop the recessed surface of the conductive structure 8a. In one embodiment, the thickness of the block copolymer layer 25 atop the recessed surface of the conductive structure 8a is greater than the thickness of the block copolymer layer 25 atop the interlevel dielectric layer 35. In one embodiment, the thickness of the block copolymer layer 25 atop the recessed surface of the conductive structure 8a is equal to the depth that the upper surface of the conductive structure 8a is recessed below the upper surface of the interlevel dielectric layer 35 plus the thickness of the block copolymer layer 25 atop the interlevel dielectric layer 35. In one embodiment, the thickness of the block copolymer layer 25 atop the recessed surface of the conductive structure 8a ranges from about ¼ to about ¾ of the Lo.

In one embodiment, a block copolymer layer 25 of polystyrene-block-polymethylmethacrylate (PS-b-PMMA) having a thickness resulting in an integer when entered into Equation 1 segregates into a heterogeneous layer of first units 25a of polystyrene matrix and second units 25b of hexagon close packed methylmethacrylate (MAA) when annealed to an elevated temperature that is above the glass transition temperature ($T_g$) of the block copolymer, but below the decomposition or degradation temperature ($T_d$) of the block copolymer. In one embodiment, the portion of the block copolymer layer 25 having a thickness that does not provide an integer when entered into Equation I produces a homogeneous 40 composition of PS-b-PMMA, as depicted in FIG. 3C.

In one embodiment, annealing of the block copolymer layer 25 may include, but is not limited to: thermal annealing (either in a vacuum or in an inert atmosphere containing nitrogen or argon), ultra-violet annealing, laser annealing, solvent vapor-assisted annealing (either at or above room temperature), supercritical fluid-assisted annealing or combinations thereof. In one embodiment, the thermal annealing step is carried out with an annealing temperature of about 200° C. to about 300° C. In one embodiment, the thermal annealing may last from less than about 1 hour to about 100 hours. In another embodiment, the thermal annealing may last from about 1 hour to about 15 hours.

In one embodiment, following annealing of the block copolymer layer 25, the structure is exposed, treated with a first development step, annealed a second time, and treated with a second development step, similar to the method describe above with reference to FIG. 1B. To reiterate, the two-development step cycle allows for the selective removal of one of a first or second unit 25a, 25b from the segregated block copolymer layer 25 selective to the other of the first or second unit 25a, 25b from the segregated block copolymer layer 25. Following, the second development step a pattern 27 is provided having nano-scaled voids 26, as depicted in FIG. 3D. In one embodiment, a block mask 30 similar to the block mask described above with reference to FIG. 2b may be employed provide additional regions of protection during the exposure step.

In one embodiment, the failure of the block copolymer layer 25 to segregate into a heterogeneous layer of first 25a and second units 25b, but instead form a homogeneous region 40 overlying the conductive structures 8 affords a self-aligned protection during the transfer of the pattern 27 into interlevel dielectric layer 35. Following development of the segregated block copolymer layer 25 to provide the pattern 27, the pattern 27 is transferred into the underlying interlevel dielectric layer 35 using an etch process that utilizes the pattern 27 as an etch mask, as depicted in FIG. 3E.

FIGS. 4A-4G depict another embodiment of the present invention, in which an air bridge structure may be provided using a variation of the embodiment described above with reference to FIGS. 3A-3E.

Figure 4A:
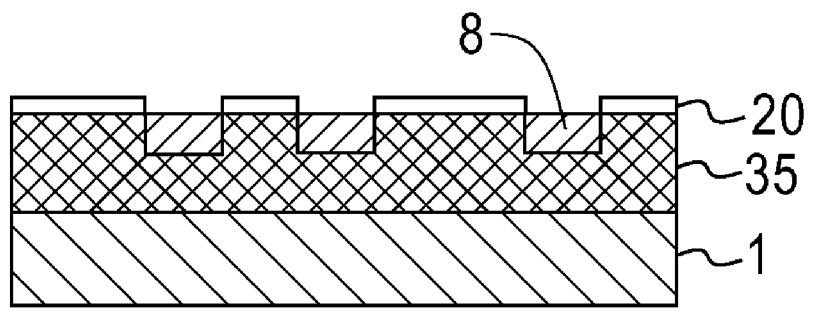
FIGS. 4A-4G are pictorial representations (through cross sectional side views) depicting processing steps that are employed in an even farther embodiment of the present invention.
Figure 4B:
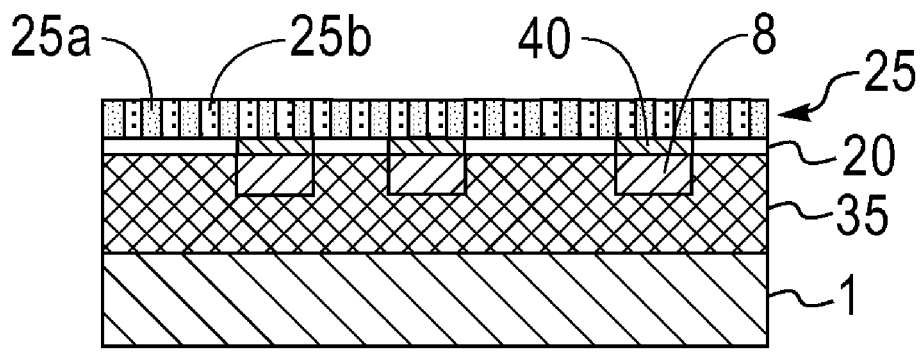

FIGS. 4A and 4B depict a process sequence that is described above with reference to FIGS. 3A-3C. As shown in FIG. 4B, in one embodiment, a block copolymer layer 25 may be formed atop the dielectric cap 20, or optional hard mask (not shown), to a thickness that results in heterogeneous segregation 25a, 25b of the block copolymer 25, and is formed atop at least one conductive structures 8 to a thickness that results in a homogeneous portion 40 of the block copolymer layer 25. The formation of the homogeneous portion 40 and heterogeneous portion 25a, 25b of the block copolymer layer 25 is dictated by the block copolymer composition and block copolymer thickness, as described above with reference to FIGS. 3A-3C. Segregation of the block copolymer layer 25 may include annealing.

Figure 4C:
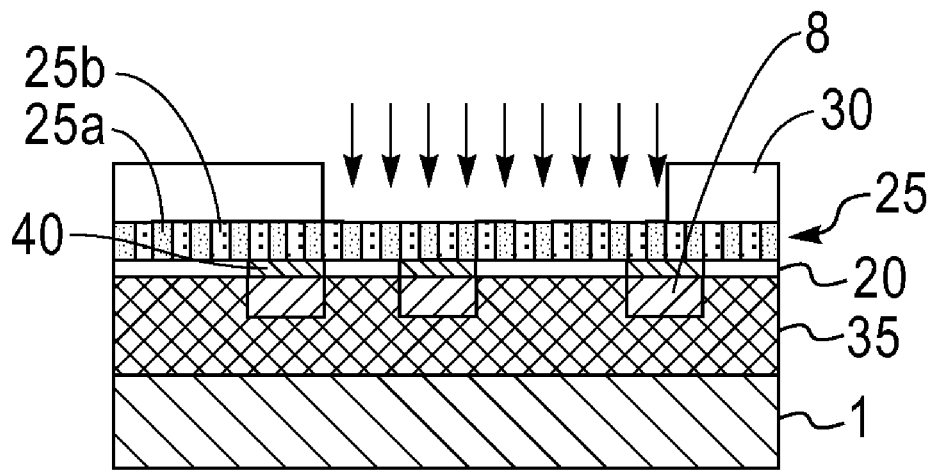

Referring to FIG. 4C, in one embodiment, once the block copolymer layer 25 is cast and annealed, the block copolymer layer 25 is exposed through a block mask 30 to expose selected regions of the segregated block copolymer layer 25.

The exposure may be provided by applied radiation, such as ultraviolet radiation, as described above with reference to FIGS. 2C-2D.

Figure 4D:
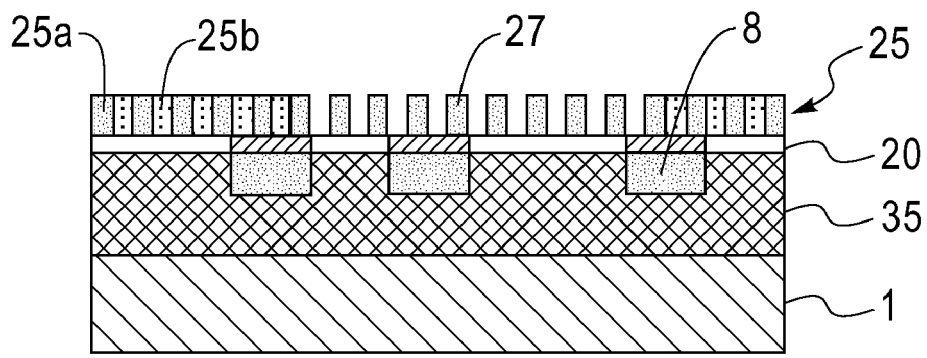

Referring to FIG. 4D, in a following process step, using an appropriate developer the exposed regions of the block copolymer layer 25 are developed, wherein the vertically oriented columns of HCP methylmethacrylate 25b may be removed to provide a pattern 27, such as a nano-scaled pattern. In one embodiment, the development cycle may include treatment with a first development step, a second anneal, and treatment with a second development step, similar to the method described above with reference to FIG. 1B. It is noted that the homogeneous portion 40 atop the conductive structure 8 may remain following the development steps.

Figure 4E:
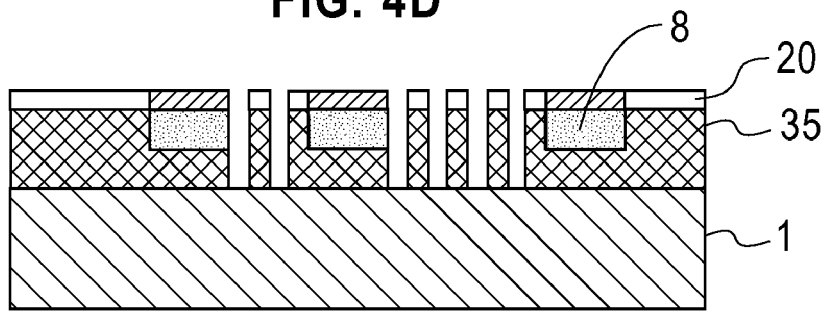

Referring to FIG. 4E, the pattern 27 can then be transferred into the interlevel dielectric layer 35 using etch processes to form nano-scale voids 81 in the interlevel dielectric layer 35, wherein the homogeneous portion 40 of the segregated copolymer layer 25 protects the conductive structures 8. In one embodiment, the pattern 27 may be transferred by an etch process, such as an anisotropic etch. In one embodiment, the nano-scale voids may be less than about 2000 nm in diameter. In another embodiment, the nano-scale voids may be less than about 10 nm in diameter. Following etching, the segregated and developed block copolymer layer 25 may be stripped.

Figure 4F:
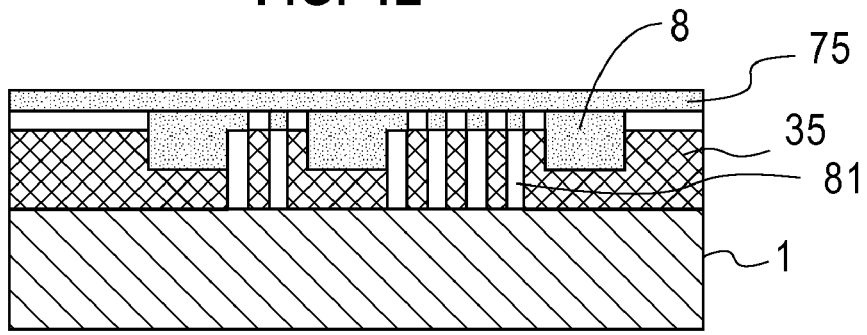

FIG. 4F depicts one embodiment of the present invention, in which a bridge dielectric 75 is formed atop a patterned dielectric cap 20a to enclose a plurality of nano-scaled pores 81 in the interlevel dielectric layer 35. In one embodiment, the patterned dielectric cap 20a is provided by an etch process utilizing the segregated and developed block copolymer layer 25 as an etch mask.

Figure 4G:
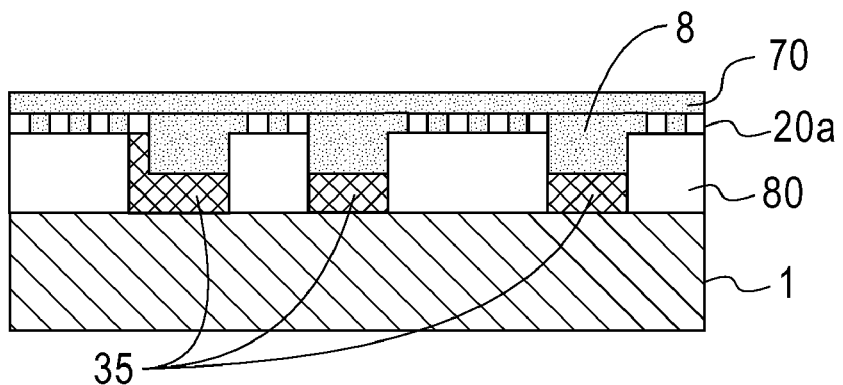

FIG. 4G depicts another embodiment of the present invention, in which prior to the formation of the bridge dielectric 75, material of the interlevel dielectric layer 35 underlying the patterned dielectric cap 20a can be extracted by a wet etch to form an air gap 80, which is then capped with the bridge dielectric 75 to provide an air bridge structure. In one embodiment, the wet etch is an isotropic etch that forms an undercut region in the interlevel dielectric layer 35 underlying the patterned dielectric cap 20a. In one embodiment, the air gap may have dimensions 20 times greater the minimum pitch of the technology node.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed as new is:

1. A method of patterning a surface comprising:
providing a heterogeneous reflectivity surface;
forming a block copolymer atop the heterogeneous reflectivity surface;
segregating the block copolymer into first units and second units;
applying a radiation to the first units and second units, wherein the heterogeneous reflectivity surface produces an exposed portion of the first units and the second units;
applying a first development step to at least the exposed portion of the first units and the second units, the first development step removing a portion of the exposed portion of the second units to expose a portion of the heterogeneous reflectivity surface;
applying an anneal to produce a spread film of first units on the portion of the heterogeneous reflectivity surface exposed by the first development step; and
applying a second development step to remove at least one of a remaining developed second unit to provide a pattern including at least one void.

2. The method of claim 1, wherein the heterogeneous reflectivity surface overlies an interlevel dielectric layer including at least one conductive structure.

3. The method of claim 2 further comprising a cap dielectric layer atop an upper surface of the interlevel dielectric layer and an upper surface of the at least one conductive structure, wherein the heterogeneous reflectivity surface is an upper surface of the cap dielectric layer.

4. The method of claim 2 further comprising transferring the pattern into the interlevel dielectric layer.

5. The method of claim 1 further comprising forming a block mask before the applying the radiation to the block copolymer.

6. The method of claim 1, wherein the block copolymer comprises polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), or polyisoprene-block-polymethylmethacrylate (PI-b-PMMA).

7. The method of claim 1, wherein the block copolymer comprises polystyrene-block-polymethylmethacrylate (PS-b-PMMA), the first units comprise polystyrene, and the second units comprise methylmethacrylate (MMA).

8. The method of claim 7, wherein the segregating of the block copolymer into the first units and the second units comprises forming a hexagonal close packed matrix in which the first units provide a matrix and the second units provide a hexagonal close packed structure comprising a columnar orientation.

9. The method of claim 8, wherein the applying of the anneal to produce the spread film of the first units on the portion of the heterogeneous reflectivity surface further includes converting the remaining developed second units into the hexagonal close packed structure comprising the columnar orientation and composed of the methylmethacrylate (MMA).

10. A method of patterning a surface comprising:
providing an interlevel dielectric layer comprising at least one conductive structure including an upper surface recessed to a depth below an upper surface of the interlevel dielectric layer;
forming a block copolymer atop the upper surface of the at least one conductive structure and atop the upper surface of the interlevel dielectric layer, wherein a first thickness of the block copolymer atop the at least one conductive structure is greater than a second thickness of the block copolymer atop the interlevel dielectric layer;
segregating the block copolymer having the second thickness into a heterogeneous layer of first units and second units, wherein the block copolymer having the first thickness remains homogeneous;

removing at least one of the first units or the second units to provide a pattern; and transferring the pattern into the interlevel dielectric layer.

11. The method of claim 10, wherein the depth that the upper surface of the at least one conductive structure is recessed below the upper surface of the interlevel dielectric layer ranges from 1/3 to 3/4 of the second thickness of the block copolymer atop the interlevel dielectric layer.

12. The method of claim 10, wherein the block copolymer comprises polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide -block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), or polyisoprene-block-polymethylmethacrylate (PI-b-PMMA).

13. The method of claim 10, wherein the segregating of the block copolymer having the second thickness into the heterogeneous layer of the first units and the second units comprises annealing the block copolymer to segregate the block copolymer into a hexagonal close packed matrix in which the first units provide a matrix and the second units provide a hexagonal close packed structure having a columnar orientation.

14. The method of claim 10, wherein the removing of the at least one of the first units or the second units to provide the pattern includes an exposure to a radiation, a first development after the exposure, an anneal after the first development, and a second development after the anneal.

15. The method of claim 10, wherein the transferring the pattern into the interlevel dielectric layer comprises an anisotropic etch to provide a void in the interlevel dielectric layer.

16. The method of claim 10, further comprising forming a bridge dielectric overlying the interlevel dielectric to enclose the void in the interlevel dielectric.

* * * * *